United States Patent
Li et al.

(10) Patent No.: US 8,361,680 B2
(45) Date of Patent: Jan. 29, 2013

(54) PIGMENT DISPERSION SOLUTION, PIGMENT PHOTORESIST AND COLOR FILTER

(75) Inventors: Lin Li, Beijing (CN); Zhuo Zhang, Beijing (CN); Jiuxia Yang, Beijing (CN); Jisheng Zhao, Beijing (CN); Xuan He, Beijing (CN); Haiqing Zhang, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 678 days.

(21) Appl. No.: 12/547,244

(22) Filed: Aug. 25, 2009

(65) Prior Publication Data

US 2010/0159371 A1   Jun. 24, 2010

(30) Foreign Application Priority Data

Dec. 19, 2008  (CN) .......................... 2008 1 0240447

(51) Int. Cl.
*G02B 5/20* (2006.01)

(52) U.S. Cl. ......................... 430/7; 430/270.1

(58) Field of Classification Search .................. None
See application file for complete search history.

(56) References Cited

U.S. PATENT DOCUMENTS

| | | | | |
|---|---|---|---|---|
| 5,667,580 | A * | 9/1997 | Babler | .......................... 106/499 |
| 6,071,654 | A | 6/2000 | Camp et al. | |
| 2003/0156080 | A1 | 8/2003 | Koike et al. | |
| 2004/0235985 | A1* | 11/2004 | Ichimura et al. | .............. 523/200 |
| 2007/0197684 | A1 | 8/2007 | Yamashita et al. | |
| 2008/0145772 | A1 | 6/2008 | Lee et al. | |
| 2008/0187732 | A1 | 8/2008 | Shinohara et al. | |

FOREIGN PATENT DOCUMENTS

| | | |
|---|---|---|
| CN | 1248724 A | 3/2000 |
| CN | 1397057 A | 2/2003 |
| CN | 101206398 A | 6/2008 |
| JP | 05-281414 | 10/1993 |
| WO | 2005/087884 A1 | 9/2005 |

OTHER PUBLICATIONS

English-language abstract of KR 2009066075 A (Jun. 2009).*

* cited by examiner

*Primary Examiner* — John A. McPherson
(74) *Attorney, Agent, or Firm* — Ladas & Parry LLP

(57) ABSTRACT

The present invention relates to a pigment dispersion solution, a pigment photoresist and a color filter. The pigment dispersion solution includes a colored pigment, a dispersant, a binder resin and a solvent, and further includes particles of white pigment. The pigment photoresist using the pigment dispersion solution of the present invention includes an alkali-soluble resin, a monomer, a photo initiator and an additive. The color filter using the pigment photoresist of the present invention includes a substrate, and the pigment photoresist is developed to be shaped in regions corresponding to pixels on the substrate. The present invention adopts a technical means that adding the particles of the white pigment into the pigment dispersion solution, thereby taking advantage of properties such as high reflectivity and diffused reflection on surface of the white pigment, so as to increase transmitting path and absorbing path of lights in the pigment dispersion solution. Therefore, when the pigment photoresist made of the pigment dispersion solution is irradiated by lights to cure, the curing speed could be improved distinctly, the curing time could be reduced and the curing effect could be improved.

13 Claims, No Drawings

PIGMENT DISPERSION SOLUTION, PIGMENT PHOTORESIST AND COLOR FILTER

CROSS-REFERENCE TO RELATED APPLICATIONS

This application claims priority to Chinese Patent Application No. 200810240447.0, filed on Dec. 19, 2008, entitled "Pigment Dispersion Solution, Pigment Photoresist and Color Filter", which is hereby incorporated by reference in its entirety.

FIELD OF THE TECHNOLOGY

Embodiments of the present invention relate to pigment composition technologies, and particularly to a pigment dispersion solution, a pigment photoresist and a color filter.

BACKGROUND

A color filter is an important component of the liquid crystal display to achieve color display. White lights emitting from a back light illuminate the color filter through a liquid crystal layer, and the red, green and blue lights can be displayed when the lights pass through color filter with three colors respectively, such as red, green and blue, which is disposed on the color filter and corresponds to every pixel. Various pixels with different colors are mixed to form a colorful image finally.

The conventional methods to manufacture the color filter include a staining method, a printing method, an electrodeposition method, a pigment dispersion method and so on. The pigment dispersion method becomes a main manufacturing method due to its advantages in terms of color property, image precision, photo stability and thermal stability.

A fundamental principal of the pigment dispersion method is to coat a pigment photoresist on a transparent substrate, and form the color filter through the technology of photoetching. The pigment photoresist includes a pigment dispersion solution. The pigment dispersion solution mainly containing a colored pigment, a dispersant, a binder resin and a solvent. The colored pigment in the pigment dispersion solution can determine the color of the final formed color filter. Colored pigments known in the prior art mostly could be taken as the colored pigment in the pigment dispersion solution. For example, the patent of No. JP5-281414 disclosed several kinds of pigments with red, green, blue, yellow and purple which could be taken as bepaint material of color resist ink.

Regarding the pigment photoresist formed on the color filter by the pigment dispersion method, one of the properties representing good or bad of its quality is ability to cure when the pigment photoresist on the substrate is irradiated to be cured, therefore, improving the ability to cure is an issue concerned broadly in the prior art.

SUMMARY

The object of the present invention is to provide a pigment dispersion solution, a pigment photoresist and a color filter, so as to improve the curing ability of the pigment photoresist material which coming from the pigment dispersion solution when irradiated by lights.

In order to achieve the above object, the embodiments of the present invention provide a pigment dispersion solution comprising a colored pigment, a dispersant, a binder resin and a solvent, and the pigment dispersion solution further comprises particles of white pigment.

In order to achieve the above object, the embodiments of the present invention also provide a pigment photoresist comprising the pigment dispersion solution of the present invention. The pigment photoresist further comprises an alkali-soluble resin, a monomer, a photo initiator and an additive.

In order to achieve the above object, the embodiments of the present invention further provide a color filter using the pigment photoresist of the present invention. The color filter comprises a substrate, and the pigment photoresist is developed to be shaped respectively in regions corresponding to pixels on the substrate.

It can be seen from the above technical solution that the present invention adopts a technical means that adding the particles of the white pigment into the pigment dispersion solution, thereby taking advantage of properties such as high reflectivity and diffused reflection on surface of the white pigment, so as to increase transmitting path and absorbing path of lights in the pigment dispersion solution. Therefore, when the pigment photoresist made of the pigment dispersion solution is irradiated by lights to cure, the curing speed could be improved distinctly, the curing time could be reduced and the curing effect could be improved.

DETAILED DESCRIPTION

The present invention is further detailed in conjunction with the accompanying drawings and embodiments.

In the embodiment one of a pigment dispersion solution of the present invention, the pigment dispersion solution specifically includes a colored pigment, a dispersant, a binder resin and a solvent. The pigment dispersion solution further includes particles of white pigment. The white pigment preferably adopts white inorganic pigment, for example, magnesium oxide, barium sulfate or titanium dioxide, etc. The weight percentage of the white pigment in the pigment dispersion solution is about 0.05%-8%, preferably is 0.3%-4%.

In the above pigment dispersion solution, except for the white pigment, original colored pigment is organic pigment, that is, may be adopt a red pigment, a blue pigment or a green pigment existing in the prior art.

The white pigment own high reflectivity, therefore, when the particles of the white pigment and other colored pigments are used together, the particles of the white pigment in the pigment dispersion solution can diffused reflect lights on surfaces of the particles while the lights pass through coating layer including the pigment dispersion solution, which can increase the transmitting path of the lights in the coating layer, that is, the path of absorbing lights could be increased. When the pigment dispersion solution of the present embodiment is used in the pigment photoresist, and is coated on the substrate to cure by irradiation. Because the absorbing path of ultraviolet radiation is increased, the curing speed of the pigment photoresist could be increased, the curing time could be reduced, and the effect of the pigment photoresist cured on the glass substrate could be improved.

The embodiment two of a pigment dispersion solution of the present invention is a preferable solution. The pigment dispersion solution includes a colored pigment, a white pigment, a dispersant, a binder resin and a solvent. The colored pigment specifically is a transparent red (P.R177) pigment, the particles of the white pigment specifically is powder particles of magnesium oxide, the dispersant specifically is polyester dispersant with a type of "EFKA4046", the binder resin specifically is poly(benzyl methyl methacrylate), and the solvent specifically is propylene glycol methyl ether acetate (PGMEA). The weight ratio among the above colored pigment, the white pigment, the dispersant, the binder resin and the solvent preferably is 15:0.3:12:3:67. The above mixture in the present embodiment is sand grinded by a sand mill for a certain time, preferably for two hours to obtain the pigment dispersion solution.

The property advantages of the pigment dispersion solution of the present invention are presented by comparative experimentation.

Firstly, a pigment dispersion solution is taken as a contrast embodiment. This pigment dispersion solution in the contrast embodiment includes a transparent red (P.R177) pigment, a polyester dispersant with a type of "EFKA4046", a poly(benzyl methyl methacrylate) and a solvent of propylene glycol methyl ether acetate (PGMEA). The weight ratio among the colored pigment, the dispersant, the resin and the solvent is 15:12:3:70. Similarly, the mixture is sand grinded by the sand mill for two hours to obtain the pigment dispersion solution.

Secondly, the pigment dispersion solution of the present embodiment and the pigment dispersion solution taken as the contrast embodiment are used to make the pigment photoresist respectively. The pigment photoresist is coated on two glass substrates respectively, and the thickness of the coating layers of the pigment photoresist is 1.5 microns (μm).

Finally, their chromatic values are measured respectively by a chroma meter. The measuring results are shown in table 1, where values of x, y and Y are color coordinates respectively.

TABLE 1

|  | Value of x | Value of y | Value of Y |
|---|---|---|---|
| The present embodiment | 0.650 | 0.331 | 19.325 |
| The contrast embodiment | 0.632 | 0.324 | 21.182 |

It can be seen from the measuring results shown in table 1 that, after curing, the chromatic value of the pigment photoresist of the present embodiment, which is made of the pigment dispersion solution added the particles of the white pigment with high reflectivity, is better than the chromatic value of the pigment photoresist of the contrast embodiment. In condition of achieving the same chromatic value, the thickness of the coating layer coated by using the pigment photoresist of the present invention embodiments could be reduced, thereby reducing cost. If the thickness of the coating layers of the pigment photoresist is the same, the present invention embodiments could achieve better chromatic values.

The pigment photoresist of the embodiment of the present invention specifically is made of the pigment dispersion solution of the present invention, and the pigment photoresist further includes a photo initiator, a monomer, an alkali-soluble resin and other additives and so on. When the pigment photoresist of the present invention is irradiated to cure on a glass substrate which is taken as the substrate, a better curing effect could be achieved, and the formed color filter has a better chromatic value.

In the embodiment of the color filter of the present invention, the color filter includes a substrate, which preferably is a transparent glass substrate. The pigment photoresist of the present invention is developed to be shaped respectively in regions corresponding to pixels on the glass substrate, that is, the pigment photoresist is coated on the glass substrate firstly, and then is shaped as specific shapes of corresponding pixel regions on the glass substrate by being exposed and developed.

The pigment dispersion solution of the present invention includes the particles of the white pigment with high reflectivity. The diffused reflection function of the particles of the white pigment to lights effectively increases the path of absorbing lights in the pigment dispersion solution. Therefore, the effect of the pigment photoresist, which is made of the pigment dispersion solution, cured on the substrate by irradiated could be improved. In addition, the experimentation testifies that when the pigment photoresist made of the pigment dispersion solution of the present invention is cured on the substrate, its chromatic value is better.

Finally, it should be noted that the above embodiments are merely provided for describing the technical solutions of the present invention, but not intended to limit the present invention. It should be understood by those of ordinary skill in the art that although the present invention has been described in detail with reference to the foregoing embodiments, modifications can be made to the technical solutions described in the foregoing embodiments, or equivalent replacements can be made to some technical features in the technical solutions, as long as such modifications or replacements do not cause the essence of corresponding technical solutions to depart from the spirit and scope of the present invention.

What is claimed is:

1. A pigment photoresist comprising a pigment dispersion solution,
    wherein the pigment dispersion solution comprises a colored pigment, a dispersant, a binder resin, a solvent and particles of white pigment,
    wherein the pigment photoresist further comprises an alkali-soluble resin, a monomer, a photo initiator and an additive, and
    wherein surface of the particles of the white pigment being capable of diffused reflecting light for curing the photoresist.

2. The pigment photoresist according to claim 1, wherein the white pigment is a white inorganic pigment.

3. The pigment photoresist according to claim 1, wherein the white pigment is magnesium oxide, barium sulfate or titanium dioxide.

4. The pigment photoresist according to claim 1, wherein the weight percentage of the white pigment in the pigment dispersion solution is 0.05%-8%.

5. The pigment photoresist according to claim 4, wherein the weight percentage of the white pigment in the pigment dispersion solution is 0.3%-4%.

6. The pigment photoresist according to claim 1, wherein the colored pigment is a red pigment, a blue pigment or a green pigment, the white pigment is magnesium oxide, the dispersant is polyester dispersant, the binder resin is poly(benzyl methyl methacrylate), and the solvent is propylene glycol methyl ether acetate.

7. The pigment photoresist according to claim 6, wherein the weight ratio among the colored pigment, the white pigment, the dispersant, the binder resin and the solvent is 15:0.3:12:3:67.

8. A color filter using the pigment photoresist according to claim 1, wherein the color filter comprises a substrate, and the pigment photoresist is developed to be shaped respectively in regions corresponding to pixels on the substrate.

9. The color filter according to claim 8, wherein the white pigment is a white inorganic pigment.

10. The color filter according to claim 8, wherein the weight percentage of the white pigment in the pigment dispersion solution is 0.05%-8%.

11. The color filter according to claim 10, wherein the weight percentage of the white pigment in the pigment dispersion solution is 0.3%-4%.

12. The color filter according to claim 8, wherein the colored pigment is a red pigment, a blue pigment or a green pigment, the white pigment is magnesium oxide, the dispersant is polyester dispersant, the binder resin is poly(benzyl methyl methacrylate), and the solvent is propylene glycol methyl ether acetate.

13. The color filter according to claim 12, wherein the weight ratio among the colored pigment, the white pigment, the dispersant, the binder resin and the solvent is 15:0.3:12:3:67.

* * * * *